(12) United States Patent
Shimizu et al.

(10) Patent No.: US 9,611,114 B2
(45) Date of Patent: Apr. 4, 2017

(54) TAPE FEEDER, COMPONENT MOUNTING APPARATUS AND COMPONENT FEEDING METHOD

(71) Applicant: PANASONIC INTELLECTUAL PROPERTY MANAGEMENT CO., LTD., Osaka (JP)

(72) Inventors: Junkei Shimizu, Yamanashi (JP); Kazunori Kanai, Yamanashi (JP); Masayuki Higashi, Yamanashi (JP); Tatsuo Yamamura, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 36 days.

(21) Appl. No.: 14/552,906

(22) Filed: Nov. 25, 2014

(65) Prior Publication Data

US 2015/0147143 A1    May 28, 2015

(30) Foreign Application Priority Data

Nov. 28, 2013    (JP) ................................ 2013-245744

(51) Int. Cl.
*B65H 20/20*        (2006.01)
*H05K 13/04*        (2006.01)

(52) U.S. Cl.
CPC ......... *B65H 20/20* (2013.01); *H05K 13/0417* (2013.01)

(58) Field of Classification Search
CPC .... B65H 20/20; B65H 20/22; B65H 2553/51; B65H 21/00; B65H 19/1815; B65H 20/00; H05K 13/0417
See application file for complete search history.

(56) References Cited

U.S. PATENT DOCUMENTS

2011/0243695 A1    10/2011    Hwang et al.

FOREIGN PATENT DOCUMENTS

JP    2011-211169 A    10/2011

*Primary Examiner* — Michael McCullough
(74) *Attorney, Agent, or Firm* — Pearne & Gordon LLP

(57) ABSTRACT

There is provided a tape feeder that feeds a carrier tape to supply components to a component suction position for a mounting head in a component mounting apparatus. The tape feeder includes a first tape feed mechanism which is provided in a downstream side and feeds a preceding tape to the component suction position, and a second tape feed mechanism provided in an upstream side and feeds a following tape from a tape introducing port side toward the first tape feed mechanism. The tape feeder also includes a tape slipping-off informing unit which informs the component mounting apparatus that the following tape is slipped off from the second tape feed mechanism. For example, the tape slipping-off informing unit decides that the following tape is slipped off when a rotation of a sprocket of the second tape feed mechanism in an opposite direction is detected.

7 Claims, 10 Drawing Sheets

TAPE FEEDER, COMPONENT MOUNTING APPARATUS AND COMPONENT FEEDING METHOD

CROSS REFERENCE TO RELATED APPLICATIONS

This application is based upon and claims the benefit of priority of Japanese Patent Application No. 2013-245744 filed on Nov. 28, 2013, the contents of which are incorporated herein by reference in its entirety.

BACKGROUND OF THE INVENTION

1. Field of the Invention

The present invention relates to a tape feeder, a component mounting apparatus and a component feeding method for supplying a component accommodated in a carrier tape to a component suction position by a mounting head.

2. Description of the Related Art

As a feeder of a component in the component mounting apparatus, a tape feeder is known. The tape feeder feeds the carrier tape which holds an electronic component, on a pitch by pitch basis to feed the electronic component to the component suction position by the mounting head. As a method for continuously feeding the components without stopping a mounting operation in the tape feeder, a tape splicing method is usually used that a new following carrier tape (a following tape) is connected to a terminal end part of a previously attached preceding carrier tape (a preceding tape). In this splicing system, an operator needs to carry out a complicated tape splicing operation every time that the tape is supplied. Accordingly, a work load thereof is desired to be reduced. Therefore, as a new tape supply system, a tape feeder of a splicing-less system is used that a following tape is set to the tape feeder without carrying out the tape splicing operation (for instance, see JP-A-2011-211169).

In the related art disclosed in JP-A-2011-211169, in a tape insert part provided in a rear end part of the tape feeder and a pick-up part which feeds a carrier tape to a component pick-up position, component feeding and driving parts are arranged and used which have structures in which sprockets are respectively driven by driving motors to individually move a preceding tape and the following tape. By the above-described structures, the tape can be fed without splicing the preceding tape to the following tape.

SUMMARY OF THE INVENTION

However, in the usual technique including the example of JP-A-2011-211169, when the carrier tape is continuously fed to the tape feeder in the splicing-less system, the following inconveniences disadvantageously arise. Namely, in the splicing-less system, since the preceding tape is not integrally connected to the following tape, when an external force is applied to the following tape due to an inadequate action of an operator after the following tape is attached, an inconvenience sometimes arises that the attached following tape is slipped off from the sprocket. Then, when an operation is continuously carried out in a state where the slipping-off of the tape is not detected, the components are out of stock to cause an apparatus to stop so that the rate of operation of equipment is lowered. Thus, such inconveniences frequently occur, so that productivity is deteriorated.

Thus, it is an object of the present invention to provide a tape feeder, a component mounting apparatus and a component feeding method which can prevent the apparatus from being stopped due to a slipping-off of a following tape to improve productivity.

An aspect of the present invention provides a tape feeder that feeds a carrier tape in which components are accommodated on a pitch by pitch basis to supply the components to a component suction position for a mounting head in a component mounting apparatus which picks up, holds and mounts the components on a board by the mounting head, the tape feeder including: a tape running path provided and communicated from a tape introducing port opened in an upstream end part in a tape feeding direction in a feeding on the pitch by pitch basis to the component suction position to guide the carrier tape on the tape running path; a first tape feed mechanism which is provided in a downstream side in the tape running path and feeds a preceding tape which is firstly fed of two carrier tapes introduced from the tape introducing port in tandem on the pitch by pitch basis to the component suction position; a second tape feed mechanism provided in an upstream side in the tape running path and feeds a following tape which is subsequently fed of the two carrier tapes in tandem from the tape introducing port side toward the first tape feed mechanism; and a tape slipping-off informing unit which informs the component mounting apparatus that the following tape is slipped off from the second tape feed mechanism, wherein the second tape feed mechanism includes a sprocket which allows a plurality of feed pins provided on an outer peripheral surface of the sprocket to be fitted in feed holes of the carrier tape to feed the carrier tape in a state where the sprocket is engaged with the carrier tape by rotating the sprocket in a normal direction so as to feed the carrier tape, and a rotation detecting unit which detects a rotation of the sprocket, and the tape slipping-off informing unit decides that the following tape is slipped off from the second tape feed mechanism in accordance with a detection of a rotation of the sprocket in an opposite direction to the normal direction by the rotating detecting unit and informs the component mounting apparatus that the tape is slipped off from the second tape feed mechanism.

Another aspect of the present invention provides a component mounting apparatus which picks up, holds, takes out and mounts components on a board by a mounting head, the component mounting apparatus including: a tape feeder that feeds a carrier tape in which the components are accommodated on a pitch by pitch basis to supply the components to a component suction position for the mounting head, wherein the tape feeder includes: a tape running path provided and communicated from a tape introducing port opened in an upstream end part in a tape feeding direction in a feeding on the pitch by pitch basis to the component suction position to guide the carrier tape on the tape running path; a first tape feed mechanism which is provided in a downstream side in the tape running path and feeds a preceding tape which is firstly fed of two carrier tapes introduced from the tape introducing port in tandem on the pitch by pitch basis to the component suction position; a second tape feed mechanism provided in an upstream side in the tape running path and feeds a following tape which is subsequently fed of the two carrier tapes in tandem from the tape introducing port side toward the first tape feed mechanism; and a tape slipping-off informing unit which informs the component mounting apparatus that the following tape is slipped off from the second tape feed mechanism, wherein the second tape feed mechanism includes a sprocket which allows a plurality of feed pins provided on an outer peripheral surface of the sprocket to be fitted in feed holes of the carrier tape to feed the carrier tape in a state where the sprocket is engaged with the carrier tape by rotating the sprocket in a normal direction so as to feed the carrier tape, and a rotation detecting unit which detects a rotation of the sprocket, and the tape slipping-off informing unit decides that the following tape is slipped off from the second tape feed mechanism in accordance with a detection of a rotation of the sprocket in an opposite direction to the normal direction by the rotating detecting unit and informs the component mounting apparatus that the tape is slipped off from the second tape feed mechanism.

Still another aspect of the present invention provides a component feeding method for feeding a carrier tape in which components are accommodated on a pitch by pitch basis by a tape feeder to supply the components to a component suction position for a mounting head in a component mounting apparatus which picks up, holds and mounts the components on a board by the mounting head, the component feeding method including: a first tape feed step for feeding, by a first tape feed mechanism, a preceding tape which is firstly fed of two carrier tapes introduced in tandem on the pitch by pitch basis in a tape feeding to the component suction position; a second tape feed step for feeding a following tape which is subsequently fed of the two carrier tapes in tandem from a tape introducing port side toward the first tape feed mechanism; and a tape slipping-off informing step for informing that the following tape is slipped off when it is decided that the following tape is slipped off from the second tape feed mechanism.

According to the present invention, the apparatus can be prevented from stopping owing to a slipping-off of the following tape in the tape feeder of the splicing-less system and productivity can be improved.

DETAILED DESCRIPTION OF THE EXEMPLARY EMBODIMENTS

Figure 1:
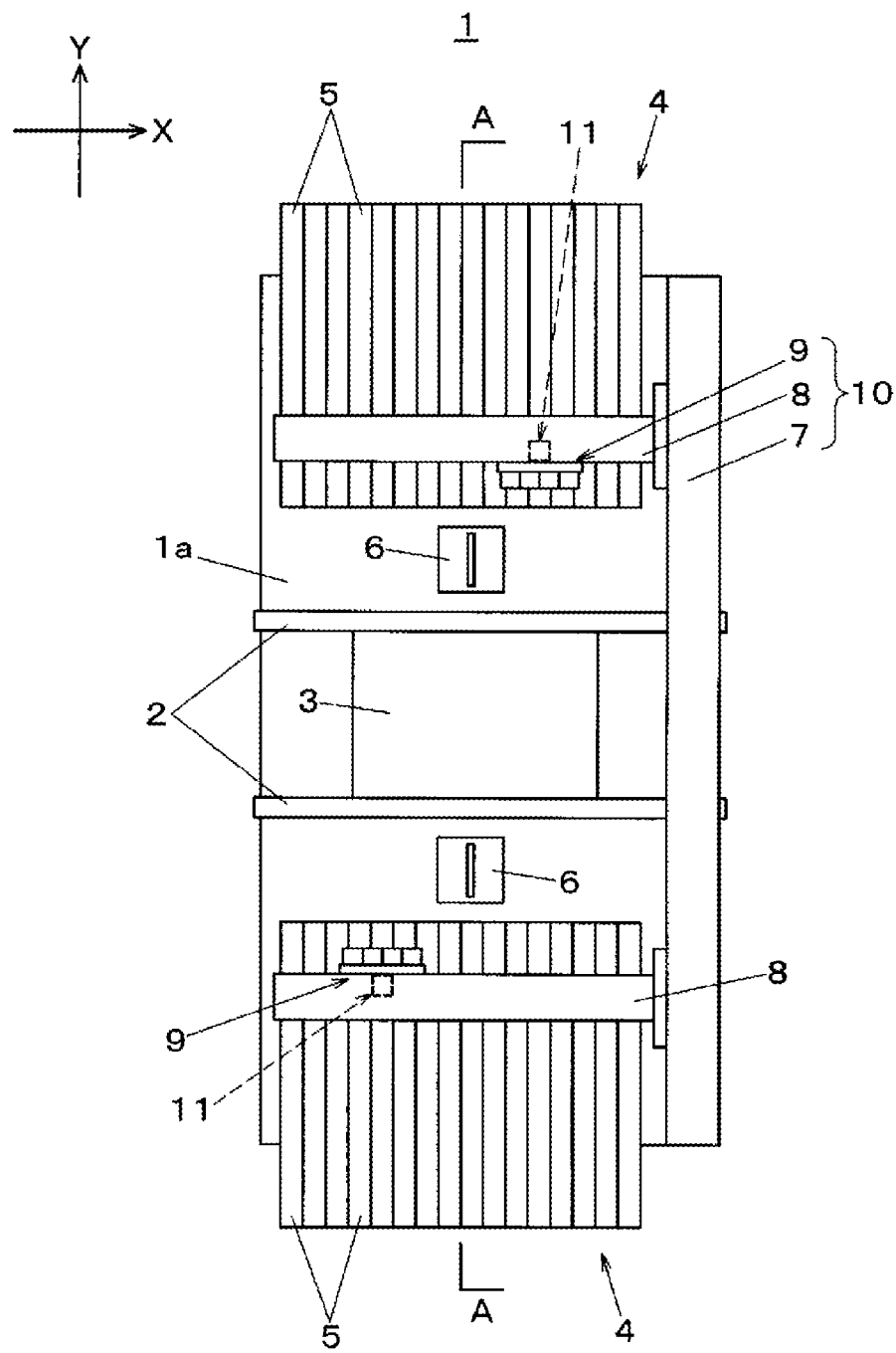
FIG. 1 is a plan view of a component mounting apparatus according to an embodiment of the present invention.

Now, an exemplary embodiment of the present invention will be described below by referring to the drawings. Initially, by referring to FIG. 1 and FIG. 2, a structure of a component mounting apparatus 1 which mounts an electronic component on a board will be described. The component mounting apparatus 1 has a function for mounting the electronic component such as a semiconductor chip on the board. FIG. 2 partly shows a cross-section taken along a line A-A in FIG. 1.

Figure 2:
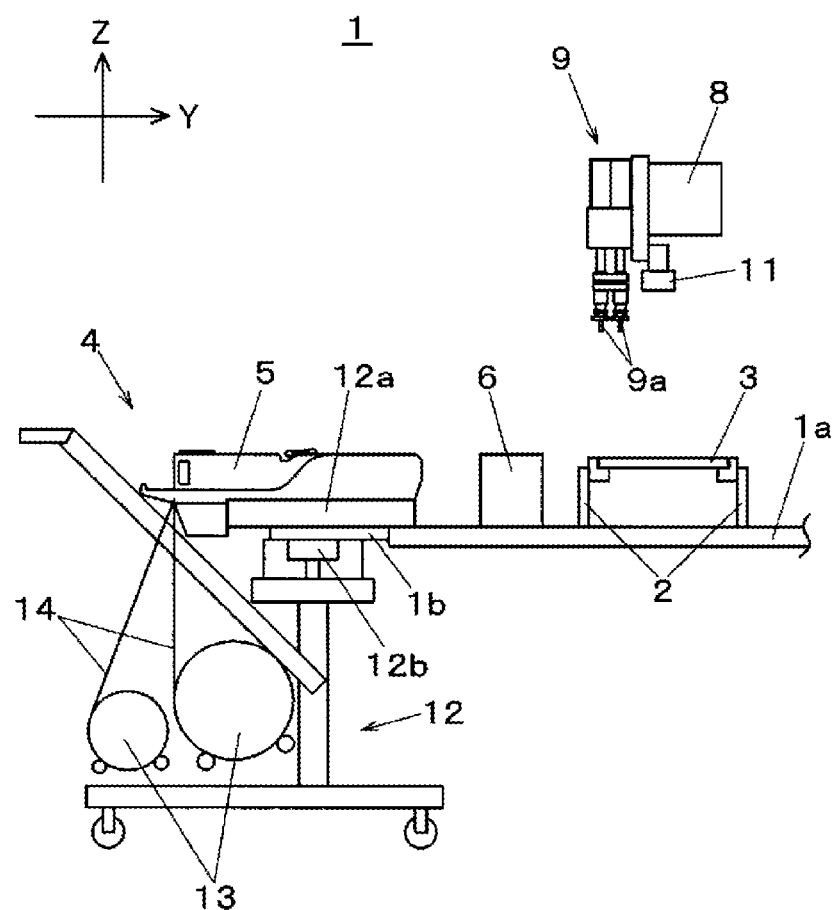
FIG. 2 is a partly sectional view of the component mounting apparatus according to the embodiment of the present invention.

In FIG. 1, in a central part of a base 1a, board conveying mechanisms 2 are arranged in a direction X (a board conveying direction). The board conveying mechanisms 2 convey a board 3 conveyed from an upstream side, position and hold the board on a mounting stage set to carry out a component mounting operation. At both sides of the board conveying mechanisms 2, component feed parts 4 are arranged. To the component feed parts 4 respectively, a plurality of tape feeders 5 are attached in parallel. The tape feeder 5 feeds a carrier tape in which the electronic components are accommodated in a tape feeding direction, namely, feeds the carrier tape from an outside of the component feed part 4 toward the board conveying mechanism 2 on a pitch by pitch basis. Thus, the electronic component is supplied to a component suction (pick-up) position by a below-described mounting head of the component mounting apparatus.

In an end part of one side in the direction X on an upper surface of the base 1a, a Y-axis moving table 7 having a linear driving mechanism is arranged. To the Y-axis moving table 7, two X-axis moving tables 8 which similarly have linear driving mechanisms are connected so as to be movable in a direction Y. To the two X-axis moving tables 8 respectively, mounting heads 9 are attached so as to be movable in the direction X. The mounting head 9 is a multiple string type head having a plurality of holding heads. To lower end parts of the holding heads, as shown in FIG. 2, suction nozzles 9a are respectively attached which can suck or pick up and hold the electronic components and can be individually lifted and lowered.

When the Y-axis moving table 7 and the X-axis moving tables 8 are driven, the mounting heads 9 are moved in the direction X and in the direction Y. Thus, the two mounting heads 9 pick up, hold and take out the electronic components by the suction nozzles 9a from the respectively corresponding component suction positions of the tape feeders 5 of the component feed parts 4 to move and mount the electronic components on mounting points of the board 3 positioned in the board conveying mechanism 2. The Y-axis moving table 7, the X-axis moving tables 8 and the mounting heads 9 form components mounting mechanisms 10 which move and mount the electronic components on the board 3 by moving the mounting heads 9 which hold the electronic components.

Between the component feed part 4 and the board conveying mechanism 2, a component recognizing camera 6 is arranged. When the mounting head 9 which takes out the electronic component from the component feed part 4 moves above the component recognizing camera 6, the component recognizing camera 6 shoots and recognizes an image of the electronic component held by the mounting head 9. To the mounting heads 9, board recognizing cameras 11 which are respectively located in lower surface sides of the X-axis moving tables 8 and move together with the mounting heads 9 are attached. When the mounting head 9 is moved, the board recognizing camera 11 moves to an upper part of the board 3 positioned on the board conveying mechanism 2 to shoot and recognize an image of the board 3. In a component mounting operation on the board 3 by the mounting head 9, the recognized result of the electronic component by the component recognizing camera 6 and the board recognized result by the board recognizing camera 11 are added to correct a mounting position.

As shown in FIG. 2, in the component feed part 4, a carriage 12 is set in which a plurality of tape feeders 5 are previously attached to a feeder base 12a. To a fixed base 1b provided in the base 1a, the feeder base 12a is clamped by a clamp mechanism 12b to fix a position of the carriage 12 in the component feed part 4. In the carriage 12, feed reels 13 are held which accommodate in wound states carrier tapes 14 holding the electronic components. The carrier tapes 14 pulled out from the feed reels 13 are fed by the tape feeder 5 on a pitch by pitch basis to the component suction positions by the suction nozzles 9a.

Figure 3:
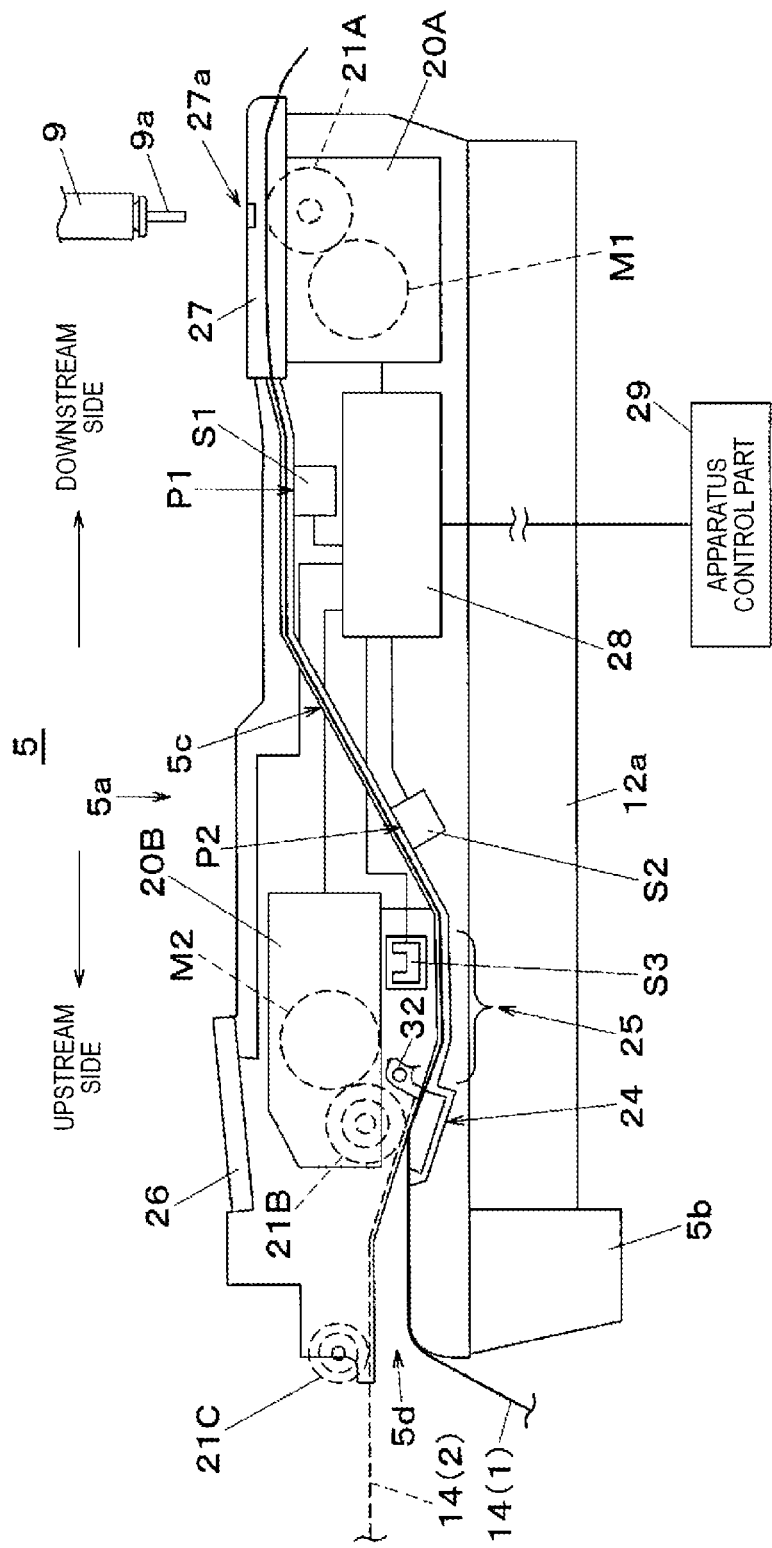
FIG. 3 is a structure explanatory view of a tape feeder according to the embodiment of the present invention.

Now, by referring to FIG. 3, a structure and a function of the tape feeder 5 will be described below. As shown in FIG. 3, the tape feeder 5 includes a main body part 5a and an attaching part 5b protruding from a lower surface of the main body part 5a. In a state where the tape feeder 5 is attached with the lower surface of the main body part 5a extended along the feeder base 12a, the tape feeder 5 is fixed and attached to the component feed part 4. A feeder controller 28 built in to control a tape feeding operation in the tape feeder 5 is electrically connected to an apparatus control part 29 of the component mounting apparatus 1.

In the main body part 5a, a tape running path 5c is provided which guides the carrier tape 14 pulled out from the feed reel 13 and taken in to the main body part 5a. The tape running path 5c is provided so as to allow a tape introducing port 5d opened in an end part of an upstream side in the tape feeding direction of the tape on a pitch by pitch basis in the main body part 5a to communicate with the component suction position where the electronic component is taken out by the mounting head 9. In a process that the component mounting operation is continuously carried out, a plurality of carrier tapes 14 which is a unit lot accommodated in one feed reel 13 are sequentially inserted from the tape introducing port 5d and fed to the tape feeder 5.

In the component mounting apparatus 1 shown in the present embodiment, a splicing-less system is used in which a tape splicing operation is not carried out that, of the two carrier tapes 14 introduced from the tape introducing port 5d in tandem, a terminal end part of the carrier tape 14(1) (abbreviate it as a preceding tape 14(1), hereinafter) which is previously attached to the tape feeder 5 and serves as an object from which the component is taken out by the mounting head 9 is spliced to a head part of the newly added and attached carrier tape 14(2) (abbreviate it as a following tape 14(2), hereinafter) due to the component out of stock by a connection tape. In the splicing-less system, the carrier tapes 14(1) and 14(2) are sequentially inserted into the tape introducing port 5d and fed in a state where the carrier tapes 14 are respectively separated from each other.

In an upper side of the tape introducing port 5d, a sprocket 21C is arranged with which the following tape 14(2) that is additionally attached is engaged. The sprocket 21C has a function which regulates the tape feeding direction of the following tape 14(2) to prevent the following tape 14(2) from slipping off. In a downstream side and the upstream side of the tape running path 5c, a first tape feed mechanism 20A and a second tape feed mechanism 20B are arranged to feed the preceding tape 14(1) and the following tape 14(2).

The second tape feed mechanism 20B provided in the upstream side has a function that continuously feeds the newly attached following tape 14(2) to the first tape feed mechanism 20A side from the tape introducing port 5d side and has a structure which rotates and drives a sprocket 21B by a second motor M2. In a lower side of the second tape feed mechanism 20B, a tape pressing mechanism 24 and a tape stopper mechanism 25 (see FIG. 5) are arranged. The following tape 14(2) introduced to the tape introducing port 5d through the sprocket 21C is pressed to the sprocket 21B by the tape pressing mechanism 24. Thus, the following tape 14(2) is engaged with the sprocket 21B so that the tape may be fed by the second tape feed mechanism 20B. The tape stopper mechanism 25 has a function that temporarily stops the head part of the following tape 14(2) which is newly inserted in a state where the preceding tape 14(1) is attached by a stopper member 32.

The first tape feed mechanism 20A provided in the downstream side has a function that feeds the preceding tape 14(1) prescribed pitch at a time to the component suction position by the mounting head 9 and has a structure that rotates and drives a sprocket 21A by a first motor M1. To an upper part of the first tape feed mechanism 20A, a pressing member 27 is attached which presses the preceding tape 14(1) from an upper part and exposes the component accommodated in the preceding tape 14(1). The electronic component fed on a pitch by pitch basis is picked up by the suction nozzle 9a of the mounting head 9 through a component taking out opening 27a formed in the pressing member 27 by a vacuum suction.

Figure 4A:
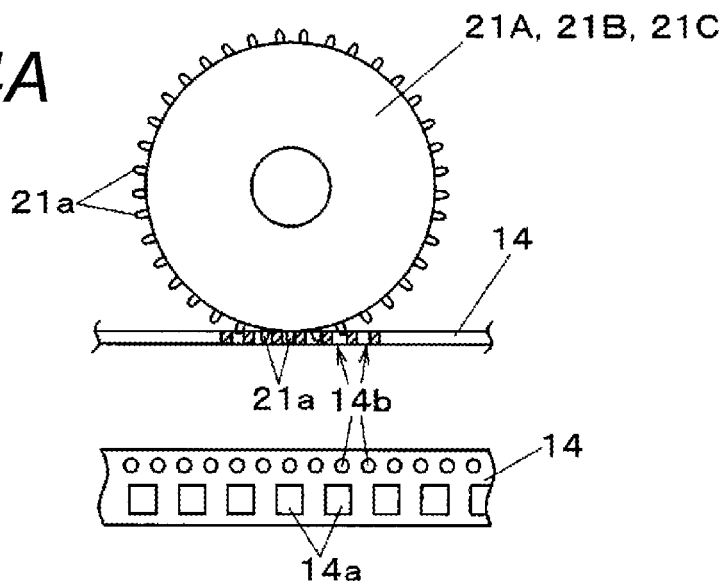
FIGS. 4A, 4B, 4C and 4D are explanatory views of functions of sprockets used in a tape feed mechanism in the tape feeder according to the embodiment of the present invention.

Now, referring to FIGS. 4A, 4B, 4C and 4D, functions of the sprockets 21A, 21B and 21C will be described below. As shown in FIG. 4A, on outer peripheral surfaces of the sprockets 21A, 21B and 21C, a plurality of feed pins 21a are provided. In the carrier tape 14, are formed at intervals of prescribed pitches component pockets 14a in which the electronic components as objects to be fed are accommodated and feed holes 14b to which the feed pins 21a are fitted. When the sprockets 21A and 21B are rotated in a state where the feed pins 21a are engaged with the feed holes 14b, the carrier tape 14 is fed.

Figure 4B:
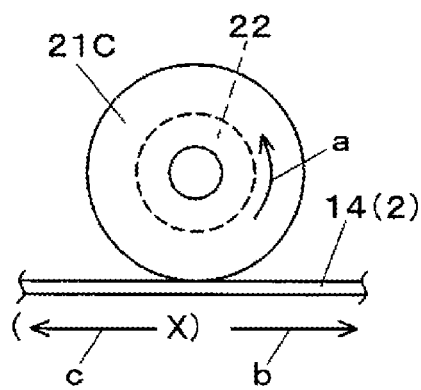

FIG. 4B shows the function of the sprocket 21C. In the sprocket 21C, a one-way clutch mechanism 22 is built in which permits the sprocket to rotate only in a rotating direction (an arrow mark a) corresponding to the tape feeding direction (an arrow mark b) from the upstream side to the downstream side and inhibits the sprocket from rotating in an opposite direction. Thus, in a state where the following tape 14(2) is engaged with the sprocket 21C, the following tape 14(2) is permitted to move only in a normal tape feeding direction (the arrow mark b) and inhibited from moving in an opposite direction (an arrow mark c). Thus, even when an external force in a pulling out direction is applied to the following tape 14(2) due to an inadequate treatment of an operator in a state where the following tape 14(2) is newly attached to supply the component, the following tape 14(2) is engaged with the sprocket 21C to prevent the following tape 14(2) from slipping off from the tape feeder 5.

Figure 4C:
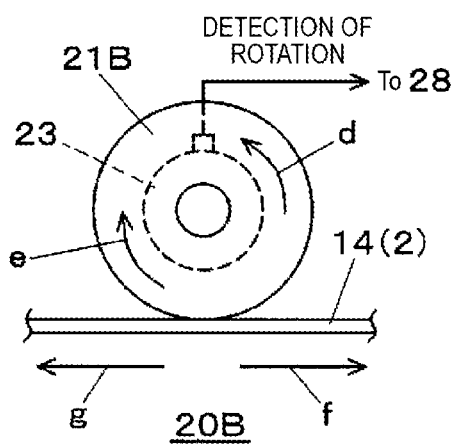

FIG. 4C shows the function of the sprocket 21B in the second tape feed mechanism 20B. As described above, the sprocket 21B is rotated and driven by the second motor M2 to continuously feed the following tape 14(2). In this driving system, under a non-excitation state that the second motor M2 is not controlled to be driven, the sprocket 21B is permitted to be idled. The following tape 14(2) engaged with the sprocket 21B is also permitted to move.

In the sprocket 21B, an encoder 23 which serves as a rotation detecting unit is built in. When the following tape 14(2) is moved in the direction of the downstream side (an arrow mark f) and in the direction of the upstream side (an arrow mark g), the sprocket 21B rotates in a normal direction (an arrow mark d) and in an opposite direction (an arrow mark e) respectively and rotation detecting signals corresponding to the rotating states are transmitted to the feeder controller 28. In the present embodiment, the rotation detecting signals transmitted to the feeder controller 28 are monitored to decide a state of the following tape 14(2) in the second tape feed mechanism 20B.

Initially, when the rotation of the sprocket 21B in the normal direction (the direction shown by the arrow mark d) is detected, it is decided that the new carrier tape 14 is inserted to start a driving operation of the second motor M2 to feed the tape. Thus, the inserted carrier tape 14 is fed to the downstream side along the tape running path 5c. Further, after the rotation in the normal direction (the direction shown by the arrow mark d) is detected, when the rotation of the sprocket 21B in the opposite direction (the direction shown by the arrow mark e), it is decided that the carrier tape 14 temporarily inserted and engaged with the sprocket 21B moves to a slipping off direction (a direction shown by an arrow mark g) owing to any cause and the tape is slipped off from the sprocket.

Figure 4D:
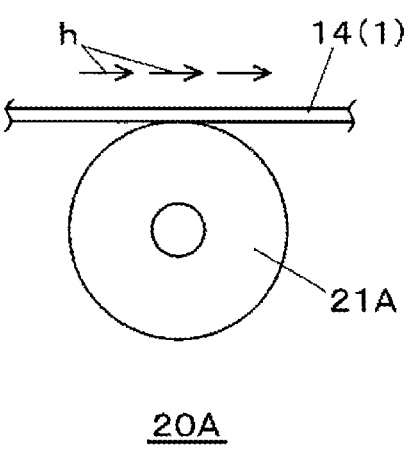

FIG. 4D shows the function of the sprocket 21A in the first tape feed mechanism 20A. As described above, the sprocket 21A is intermittently driven by the first motor M1 to feed the preceding tape 14(1) on a pitch by pitch basis at a prescribed feed pitch (an arrow mark h). Thus, the electronic components accommodated in the component pockets 14a of the carrier tape 14 are fed to the component suction positions by the mounting head 9.

In the upstream side of the first tape feed mechanism 20A in the tape running path 5c, a first detecting position P1 which detects the carrier tape 14 is set. A second detecting position P2 is set which similarly detects the carrier tape 14 in the downstream side of the second tape feed mechanism 20B and in the upstream side of the first detecting position P1. A first sensor S1 and a second sensor S2 respectively arranged in the first detecting position P1 and the second detecting position P2 detect whether or not there is the carrier tape 14 in the first detecting position P1 and the second detecting position P2. Further, in the tape stopper mechanism 25, a third sensor S3 (see FIG. 5) is arranged which detects that the following tape 14(2) abuts on the stopper member 32.

The detected results by the first sensor S1, the second sensor S2 and the third sensor S3 are transmitted to the feeder controller 28 and the feeder controller 28 controls the first tape feed mechanism 20A and the second tape feed mechanism 20B in accordance with the detected results and the rotation detected results by the encoder 23. Thus, the tape feeding operations of the preceding tape 14(1) and the following tape 14(2) are carried out in the tape feeder 5. Further, to the feeder controller 28, an operation and display panel 26 arranged in an upper surface of the tape feeder 5 in the upstream side is connected. In the operation and display panel 26, are provided an operation button through which the operator inputs a prescribed operation and a display unit such as an LED which informs the operator of prescribed contents. The operator can recognize an operating state of the tape feeder 5 and input operations of prescribed items by the operation and display panel 26.

Figure 5:
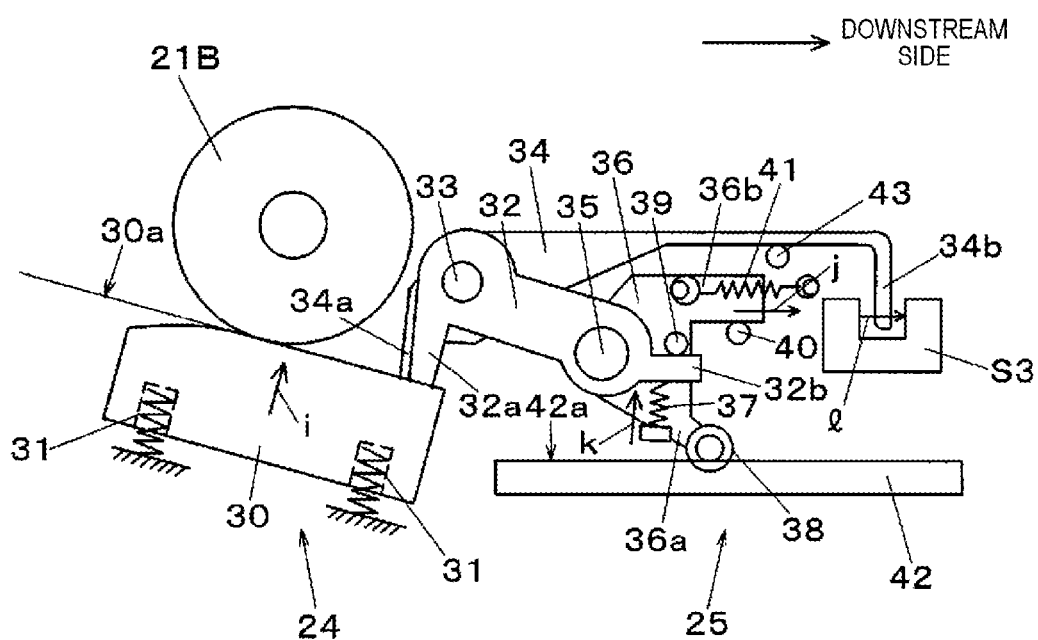
FIG. 5 is an explanatory view of structure of a tape stopper mechanism in the tape feeder according to the embodiment of the present invention.

Now, referring to FIG. 5 and FIGS. 6A to 6D, functions and structures of the tape pressing mechanism 24 and the tape stopper mechanism 25 will be described below. In FIG. 5, in a lower part of the sprocket 21B, an urging block 30 is arranged which is urged upward (a direction shown by an arrow mark i) by a compression spring 31. The following tape 14(2) inserted between the sprocket 21B and the urging block 30 along a tape pressing surface 30a on an upper surface of the urging block 30 is pressed to the sprocket 21B. Thus, the feed pins 21a are fitted to the feed holes 14b so that the following tape 14(2) is engaged with the sprocket 21B.

In an end part of the tape pressing surface 30a in the downstream side, an abutting part 32a which is bent downward in the upstream side of the stopper member 32 forming the tape stopper mechanism 25 is arranged so as to be engaged or disengaged by a rotation on a first shaft part 35. The first shaft part 35 is a fixed supporting point to which a position of the main body part 5a of the tape feeder 5 is fixed and which coaxially holds the stopper member 32 and a link member 36 so as to freely rotate. The link member 36 has an upper extending part 36b provided in an upper part thereof urged in the tape feeding direction (an arrow mark j) by a tension spring 41. The upper extending part 36b abuts on a stopped pin 40 to regulate a lower limit position in a vertical direction.

To a lower end of a lower extending part 36a extended obliquely downward from the link member 36, a roller 38 is attached. In the tape stopper mechanism 25, the roller 38 is pressed to a guide surface 42a of a tape feed guide 42 to guide the tape feeding operation of the carrier tape 14 by an urging force of the tension spring 41. An extending protrusion 32b extended to the downstream side from the stopper member 32 is urged upward (an arrow mark k) by a compression spring 37 fixed to the link member 36 and its upper limit position is regulated by an abutting pin 39 provided in the link member 36. By the urging fore, the stopper member 32 is displaced so as to rotate on the first shaft part 35 and the abutting member 32a which is bent downward in the upstream side is pressed to the tape pressing surface 30a of the urging block 30 from an upper part.

In an upper part of the abutting part 32a in the upstream side of the stopper member 32, a sensor dog 34 is supported which freely rotates through a second shaft part 33 as a movable supporting point. The sensor dog 34 has one end part 34a partly protruding in the upstream side from the abutting part 32a. The other end part of an elongated form is extended in the downstream side to form a light screen part 34b bent downward. In an ordinary state that the light screen part 34b abuts on a stopper pin 43 which regulates a lower limit position, the light screen part 34b screens the lights of a detection optical axis (an arrow mark l) of the third sensor S3 as a light screen type photo-switch.

When the following tape 14(2) as an object to be detected abuts on a side surface of the abutting part 32a from the upstream side, the sensor dog 34 is displaced to rotate counterclockwise on the second shaft part 33. Thus, the light screen part 34b is displaced upward to release a light screen state of the third sensor S3, so that it is detected that the following tape 14(2) reaches a stop position by the stopper member 32.

Figure 6A:
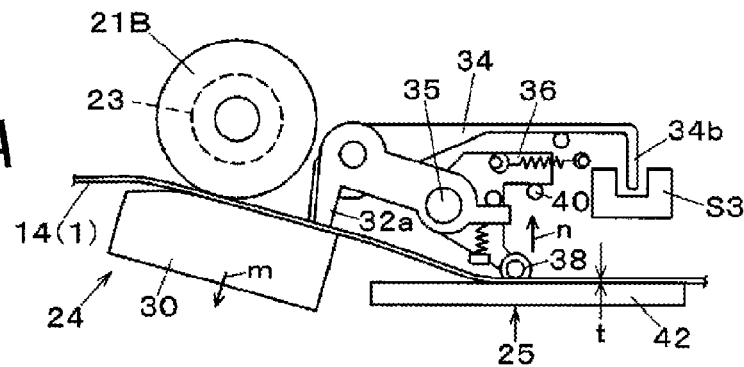
FIGS. 6A, 6B, 6C and 6D are explanatory views of functions of the tape stopper mechanism in the tape feeder according to the embodiment of the present invention.

FIG. 6A shows a state that the preceding tape 14(1) as the first carrier tape 14 is attached to the second tape feed mechanism 20B. Here, initially, since the preceding tape 14(1) is inserted between the sprocket 21B and the urging block 30 in the tape pressing mechanism 24, as described in FIG. 4C, the rotating and driving operation of the sprocket 21B is started so that the preceding tape 14(1) is fed to the downstream side.

At this time, in the tape pressing mechanism 24, the urging block 30 is pressed downward (an arrow mark m) so as to meet the thickness t of the carrier tape 14 by the carrier tape 14 inserted between the sprocket 21B and the urging block 30. Further, in the tape stopper mechanism 25, the roller 38 is pressed upward by the thickness t (an arrow mark n) by the carrier tape 14 fed on the tape feed guide 42. Thus, the link member 36 is rotated and displaced on the first shaft part 35. Then, under this state, the carrier tape 14 is fed on a pitch by pitch basis to the downstream side by the second tape feed mechanism 20B to reach the first tape feed mechanism 20A.

Figure 6B:
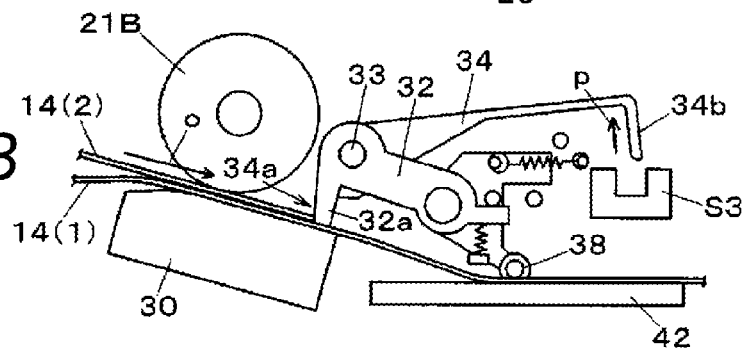

FIG. 6B shows an operation when the following tape 14(2) is newly attached in a state where the preceding tape 14(1) is already attached. In this case, the following tape 14(2) is set via the sprocket 21C shown in FIG. 4B and a head part of the following tape 14(2) is inserted (an arrow mark o) between the preceding tape 14(1) already located on the urging block 30 and the sprocket 21B. Also at this time, a rotation of the sprocket 21B in a normal direction is detected, so that the following tape 14(2) is fed to the downstream side by the second tape feed mechanism 20B.

Then, when the head part of the following tape 14(2) abuts on the abutting part 32a and presses the one end part 34a, the sensor dog 34 is rotated counterclockwise on the second shaft part 33. Thus, the light screen part 34b is displaced upward (an arrow mark p) to release the light screen state of the third sensor S3, so that it is detected that the following tape 14(2) reaches the stop position to stop the tape feeding operation by the second tape feed mechanism 20B.

Figure 6C:
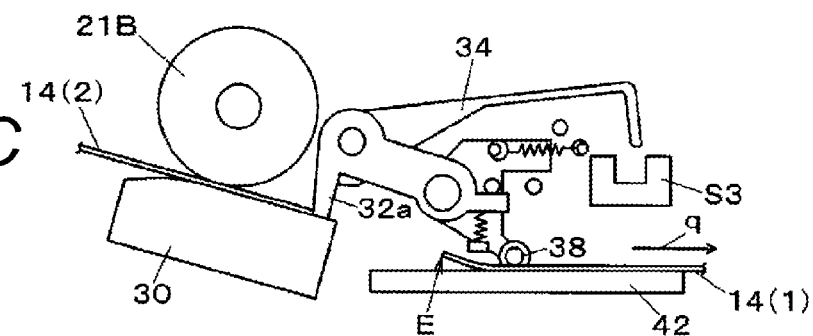

FIG. 6C shows a state that under a condition that the following tape 14(2) temporarily stops and stands by, the preceding tape 14(1) is fed to the downstream side. Namely, every time the preceding tape 14(1) serves as an object from which the component is taken out by the mounting head 9, the preceding tape 14(1) is sequentially fed on a pitch by pitch basis (an arrow mark q) by the first tape feed mechanism 20A and a terminal end part E is disengaged from the urging block 30 to reach the tape feed guide 42. Then, at timing when the terminal end part E is fed more downstream than the roller 38, the temporary stop of the following tape 14(2) by the stopper member 32 is released.

Figure 6D:
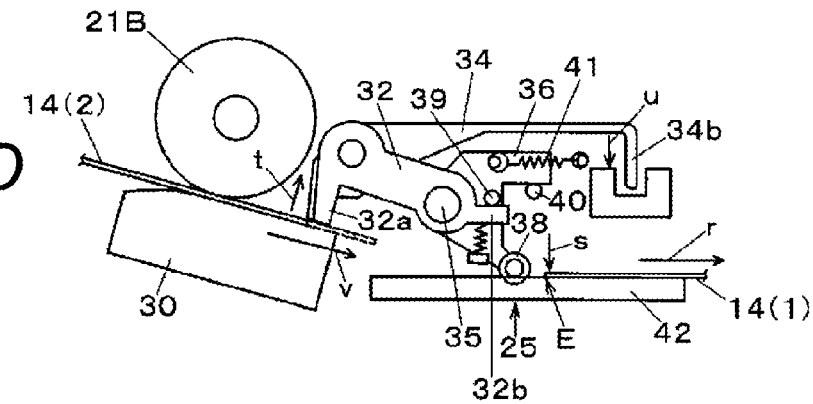

Namely, as shown in FIG. 6D, when the preceding tape 14(1) is further fed on a pitch by pitch basis (an arrow mark r) and the terminal end part E passes the roller 38, the roller 38 is displaced downward (an arrow mark s) by the urging force of the tension spring 41 and the link member 36 is rotated clockwise on the first shaft part 35. Thus, the abutting pin 39 presses downward the extending protrusion 32b. The stopper member 32 is displaced to rotate in a direction (an arrow mark t) that the abutting part 32a is separated from the urging block 30. Thus, the temporary stop state of the following tape 14(2) by the abutting part 32a is released and the light screen part 34b of the sensor dog 34 is displaced downward (an arrow mark u) to obtain the light screen state of the third sensor S3. Then, when a signal of the third sensor S3 is received, the tape feeding operation (an arrow mark v) of the following tape 14(2) by the second tape feed mechanism 20B can be carried out.

Figure 7:
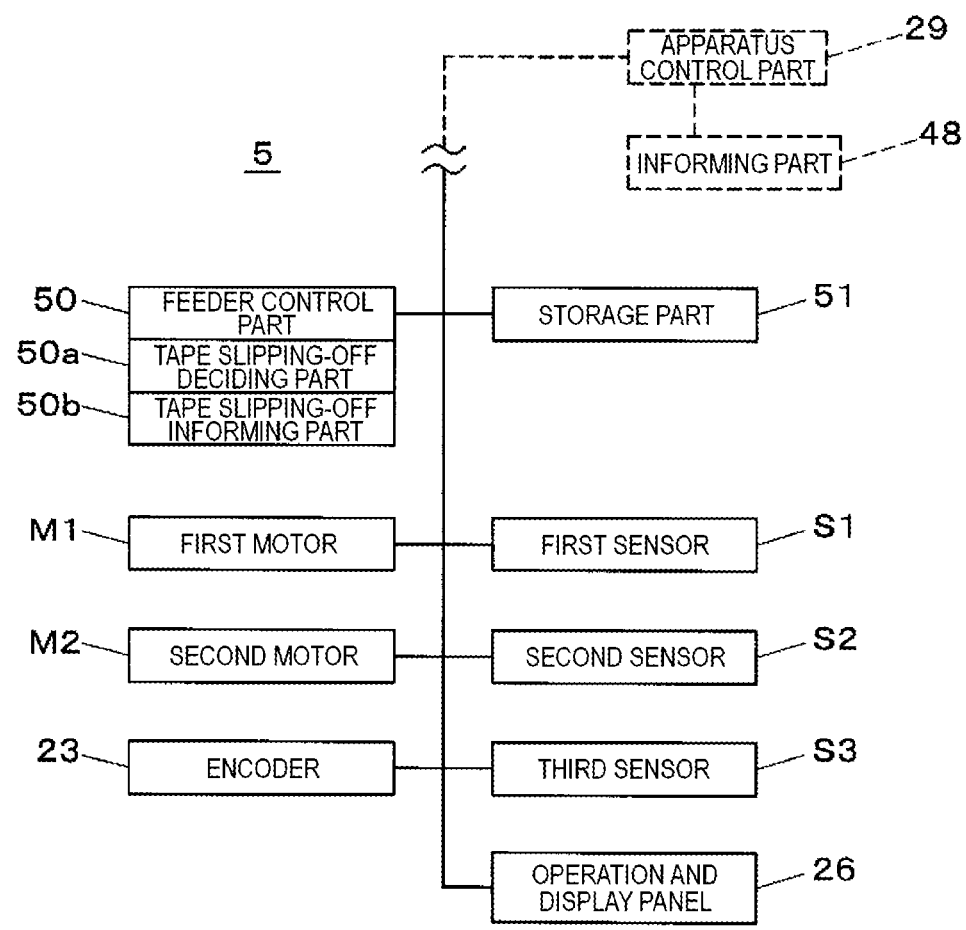
FIG. 7 is a block diagram showing a structure of a control system of the tape feeder according to the embodiment of the present invention.

Now, referring to FIG. 7, a configuration of a control system of the tape feeder 5 will be described below. A feeder control part 50 and a storage part 51 in FIG. 7 show functions of the feeder controller 28 shown in FIG. 3. The feeder control part 50 indicates a processing and calculating function provided in the feeder controller 28 to control the first motor M1 or the second motor M2 in accordance with feeder data stored in the storage part 51 as an incorporated memory, namely, data showing a tape feed speed or a feed pitch for each of kinds of tapes. This control is carried out in accordance with the inputs of operations from the operation and display panel 26 or the signals from the first sensor S1, the second sensor S2, the third sensor S3 and the encoder 23 built in the sprocket 21B.

The feeder control part 50 includes a tape slipping-off deciding part 50a and a tape slipping-off informing part 50b as internal processing functions. The tape slipping-off deciding part 50a decides that the following tape 14(2) is slipped off from the sprocket 21B of the second tape feed mechanism 20B in accordance with a rotation result of the sprocket 21B detected by the encoder 23. A decision of the slipping-off of the tape will be described by referring to FIGS. 8A to 8C.

Figure 8A:
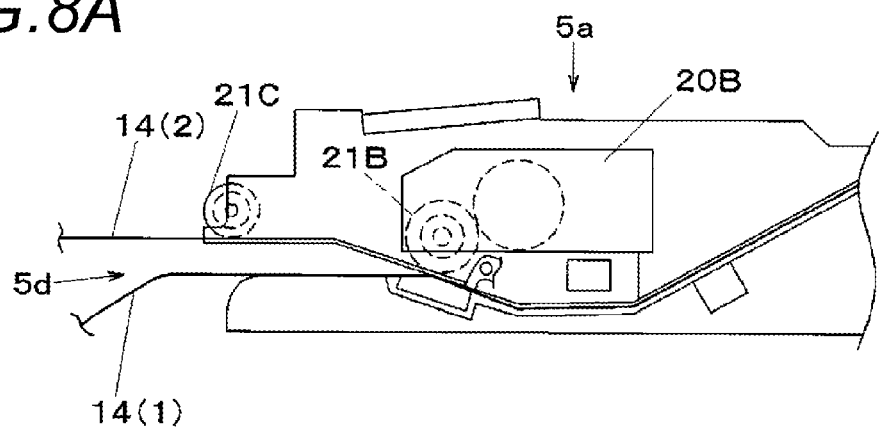
FIGS. 8A, 8B and 8C are explanatory views for explaining a decision of a slipping-off of a tape in the tape feeder according to the embodiment of the present invention.

FIG. 8A shows a state that under a condition that the preceding tape 14(1) is previously attached, the new following tape 14(2) is introduced from the tape introducing port 5d via the sprocket 21C and engaged with the sprocket 21B. At this time, the following tape 14(2) is held by the sprocket 21C. However, when a large external force is applied to the tape by an inadequate operation of the operator, an inconvenience may possibly arise that a holding state cannot be maintained only by the holding force of the sprocket 21C so that the following tape 14(2) is disengaged from the sprocket 21B. In the present embodiment, the disengagement of the tape is detected by a below-described method to inform the operator of the disengagement of the tape and rapidly and suitably handle it.

Figure 8B:
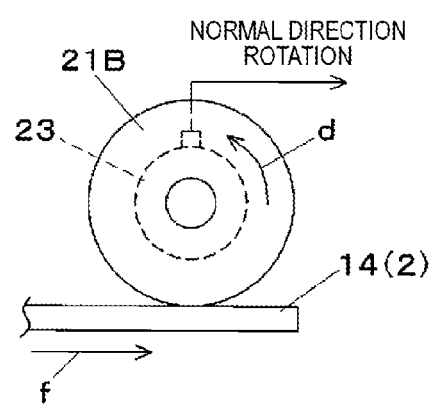
Figure 8C:
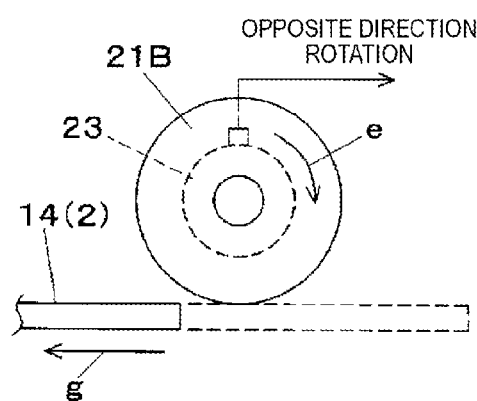

Namely, when the following tape 14(2) is attached, the tape slipping-off deciding part 50a monitors the rotation detecting signal from the encoder 23 as the rotation detecting unit. As shown in FIG. 8B, when the rotation of the sprocket 21B in the normal direction (the arrow mark d) is detected, the tape slipping-off deciding part 50a decides that the following tape 14(2) is introduced from the tape introducing port 5d (the arrow mark f). Then, after this decision, as shown in FIG. 8C, when the rotation of the sprocket 21B in the opposite direction (the arrow mark e) is detected by the encoder 23, the tape slipping-off deciding part 50a decides that the carrier tape 14(2) which is temporarily introduced and engaged with the sprocket 21B is disengaged from the sprocket 21B, moved in the opposite direction (the arrow mark g) and slipped off.

Then, the tape slipping-off informing part 50b informs the apparatus control part 29 of the component mounting apparatus 1 that the tape is slipped off which is decided by the tape slipping-off deciding part 50a. The apparatus control part 29 informs the operator that the carrier tape 14(2) is slipped off by an informing part 48 such as a display device or a signal tower provided in the component mounting apparatus 1. Accordingly, the tape slipping-off deciding part 50a and the tape slipping-off informing part 50b provided in the feeder control part 50 form a tape slipping-off informing unit which decides that the following tape 14(2) is slipped off from the second tape feed mechanism 20B in accordance with a detection of the sprocket 21B in the opposite direction to the normal direction by the encoder 23 and informs the component mounting apparatus 1 of the slipping-off state of the tape.

Now, by referring to FIG. 9A to FIG. 10C, a component feeding method in the component mounting apparatus 1 will be described below. The component is fed in such a way that the plurality of carrier tapes 14 are sequentially fed in the tape feeder 5 by the splicing-less system. FIG. 9A to FIG. 10C show processes that the preceding tape 14(1) which is firstly fed and the following tape 14(2) which is subsequently fed of the two carrier tapes 14 fed in tandem are sequentially conveyed along the tape running path 5c.

Figure 9A:
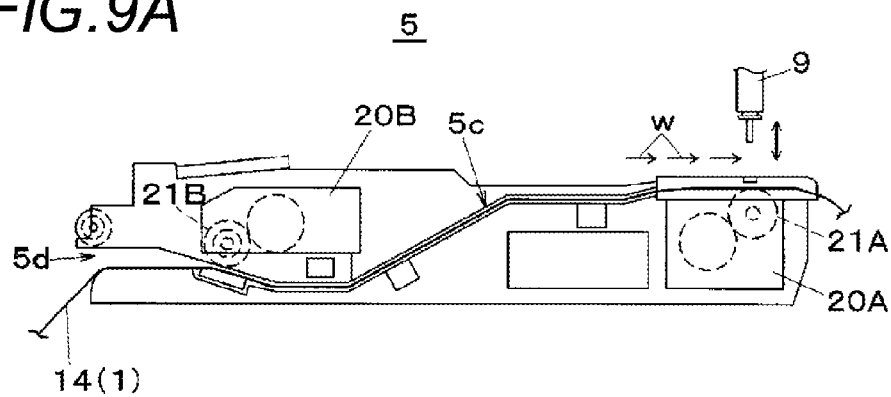
FIGS. 9A, 9B and 9C are explanatory views of a process of a tape feeding method in the tape feeder according to the embodiment of the present invention.

Initially, FIG. 9A shows a state that the component mounting operation is carrier out while the preceding tape 14(1) is conveyed along the tape running path 5c. Namely, the preceding tape 14(1) is introduced to the tape feeder 5 through the tape introducing port 5d, and fed on a pitch by pitch basis (an arrow mark w) to the component suction position by the first tape feed mechanism 20A (a first tape feed process). In the component suction position, the electronic component is taken out from the preceding tape 14(1) by the mounting head 9.

Figure 9B:
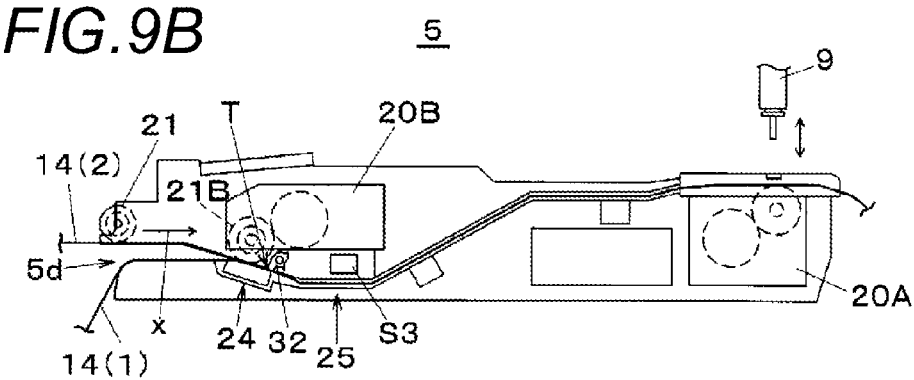

Then, in a process that the component mounting operation is continuously carried out, when the supply of the components from the preceding tape 14(1) comes near to the end, as shown in FIG. 9B, the following tape 14(2) is additionally set to supply the components. Namely, in a state where the preceding tape 14(1) is engaged with the sprocket 21B of the second tape feed mechanism 20B by the tape pressing mechanism 24, the first part of the following tape 14(2) is introduced (an arrow mark x) via the sprocket 21C arranged in the tape introducing port 5d and inserted between the sprocket 21B and the preceding tape 14(1).

Thus, the following tape 14(2) is engaged with the sprocket 21B and fed to the downstream side. When a head part T of the following tape 14(2) abuts on the stopper member 32 of the tape stopper mechanism 25, the following tape 14(2) stops (see FIG. 6B). Then, under this state, the following tape 14(2) waits and the preceding tape 14(1) is continuously fed on a pitch by pitch basis by the first tape feed mechanism 20A and the electronic components are continuously taken out by the mounting head 9.

Figure 9C:
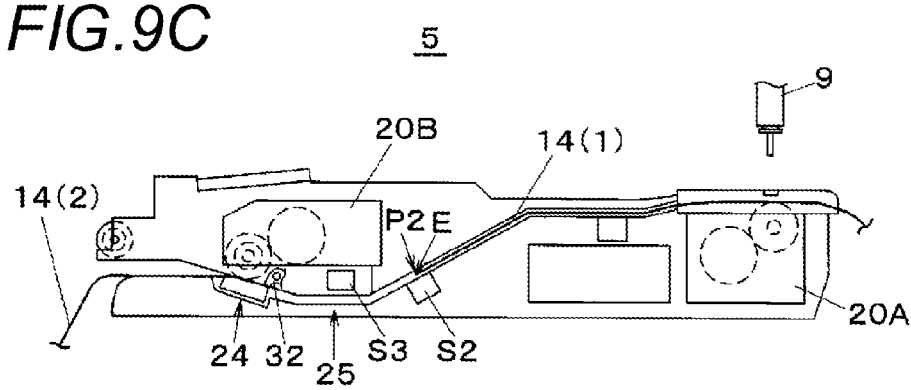

After that, in the course of feeding the preceding tape 14(1), as shown in FIG. 9C, a terminal end part E of the preceding tape 14(1) is detected by the second sensor S2. A detected result is transmitted to the feeder control part 50 (see FIG. 7). Then, the feeder control part 50 controls the first tape feed mechanism 20A and the second tape feed mechanism 20B in accordance with previously set control patterns.

Figure 10A:
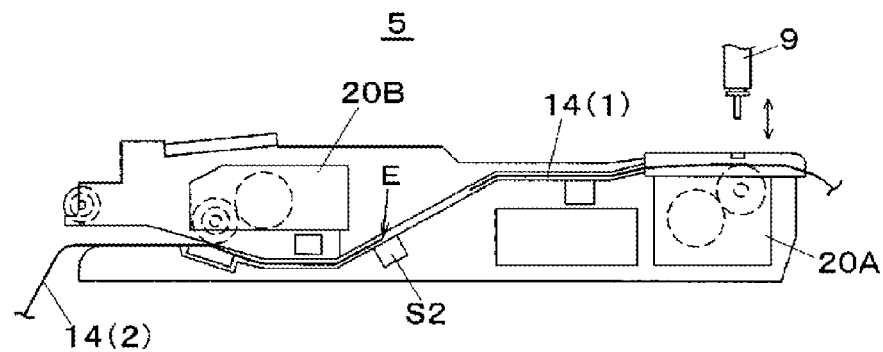
FIGS. 10A, 10B and 10C are explanatory views of a process of the tape feeding method in the tape feeder according to the embodiment of the present invention.

Namely, when the terminal end part E of the preceding tape 14(1) is detected by the second sensor S2, the second tape feed mechanism 20B is driven to move the following tape 14(2) whose temporary stop by the stopper member 32 is already released so that the head part T reaches the second detecting position P2. Then, as shown in FIG. 10A, when the head part T of the following tape 14(2) is detected by the second sensor S2, the second tape feed mechanism 20B is stopped to allow the following tape 14(2) to wait at this position. Then, under this state, the preceding tape 14(1) is continuously fed on a pitch by pitch basis by the first tape feed mechanism 20A and the electronic components are continuously taken out by the mounting head 9.

Figure 10B:
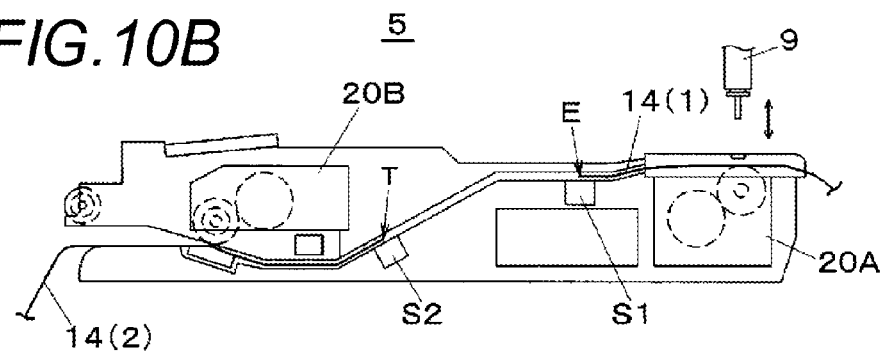
Figure 10C:
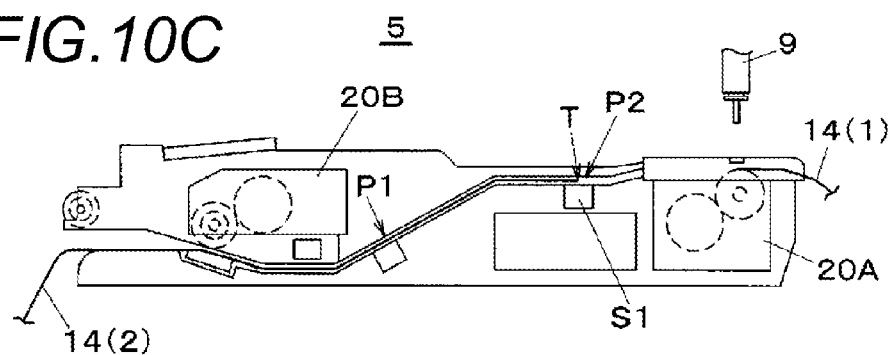

Further, in a process that the preceding tape 14(1) is fed on a pitch by pitch basis by the first tape feed mechanism 20A, as shown in FIG. 10B, when the terminal end part E of the preceding tape 14(1) is detected by the first sensor S1, the second tape feed mechanism 20B is driven, as shown in FIG. 10C, to feed the following tape 14(2) so that the head part T of the following tape 14(2) is moved from the second detecting position P2 to the first detecting position P1. Thus, the preceding tape 14(1) in which the supply of the components is finished is discharged from the tape feeder 5.

In the above-described tape feeding operation, FIGS. 9B and 9C and FIGS. 10A to 10C form a second tape feed process in which the following tape 14(2) is conveyed from the tape introducing port 5d side toward the first tape feed mechanism 20A by the second tape feed mechanism 20B. Then, in the second tape feed process, the feeder control part 50 always monitors the rotation detecting signal of the encoder 23 of the second tape feed mechanism 20B by the processing function of the tape slipping-off deciding part 50a to monitor whether or not the following tape 14(2) is slipped off from the second tape feed mechanism 20B by the method shown in FIG. 4C(1).

Here, when the feeder control part 50 decides that the following tape 14(2) is slipped off from the second tape feed mechanism 20B, the feeder control part 50 informs the apparatus control part 29 of the component mounting apparatus 1 by the processing function of the tape slipping-off informing part 50b that the tape is slipped off from the second tape feed mechanism. The component mounting apparatus 1 which receives the information informs the operator that the tape is slipped off from the second tape feed mechanism by the informing part 48 (a tape slipping-off informing process). Then, the operator who receives the information rapidly carries out a treatment such as a process that the slipped-off following tape 14(2) is attached again. Thus, the apparatus can be effectively prevented from stopping due to a break of supply of the following tape 14(2).

As described above, in the present embodiment, when the following tape 14(2) which is subsequently fed in the two carrier tapes 14 fed in tandem in the tape feeder 5 of the splicing-less system is conveyed from the tape introducing port 5d side toward the first tape feed mechanism in the downstream side by the sprocket 21B of the second tape feed mechanism 20B, if it is decided that the following tape 14(2) is slipped off from the second tape feed mechanism 20B in accordance with the rotation detecting signal of the encoder 23 incorporated in the sprocket 21B, the component mounting apparatus is informed that the tape is slipped off from the second tape feed mechanism. Thus, the apparatus is prevented from stopping due to the slipping-off of the following tape 14(2), so that productivity is improved.

The tape feeder, the component mounting apparatus and the component feeding method of the present invention can effectively prevent the apparatus from being stopped due to the slipping-off of the following tape to improve productivity, and are available for a component mounting field that electronic components are taken out from a tape feeder and mounted on a board.

What is claimed is:

1. A tape feeder that feeds a carrier tape in which components are accommodated on a pitch by pitch basis to supply the components to a component suction position for a mounting head in a component mounting apparatus which picks up, holds and mounts the components on a board by the mounting head, the tape feeder comprising:
 a tape running path provided and communicated from a tape introducing port opened in an upstream end part in a tape feeding direction in a feeding on the pitch by pitch basis to the component suction position to guide the carrier tape on the tape running path;
 a first tape feed mechanism which is provided in a downstream side in the tape running path and feeds a preceding tape which is firstly fed of two carrier tapes introduced from the tape introducing port one after another on the pitch by pitch basis to the component suction position;
 a second tape feed mechanism provided in an upstream side in the tape running path and feeds a following tape which is subsequently fed of the two carrier tapes one after another from the tape introducing port side toward the first tape feed mechanism, wherein the second tape feed mechanism includes a sprocket which allows a plurality of feed pins provided on an outer peripheral surface of the sprocket to be fitted in feed holes of the carrier tape to feed the carrier tape in a state where the sprocket is engaged with the carrier tape by rotating the sprocket in a normal direction so as to feed the carrier tape, and a rotation detecting unit which detects a rotation of the sprocket; and a tape slipping-off deciding unit which decides that the following tape is slipped off from the second tape feed mechanism in accordance with a detection of a rotation of the sprocket in an opposite direction to the normal direction by the rotating detecting unit.

2. The tape feeder according to claim 1, wherein the tape slipping-off deciding unit decides that the following tape is introduced from the tape introducing port in accordance with the detection of the rotation of the sprocket in the normal direction by the rotation detecting unit.

3. A component mounting apparatus which picks up, holds, takes out and mounts components on a board by a mounting head, the component mounting apparatus comprising:

a tape feeder that feeds a carrier tape in which the components are accommodated on a pitch by pitch basis to supply the components to a component suction position for the mounting head, wherein the tape feeder includes:

a tape running path provided and communicated from a tape introducing port opened in an upstream end part in a tape feeding direction in a feeding on the pitch by pitch basis to the component suction position to guide the carrier tape on the tape running path;

a first tape feed mechanism which is provided in a downstream side in the tape running path and feeds a preceding tape which is firstly fed of two carrier tapes introduced from the tape introducing port one after another on the pitch by pitch basis to the component suction position;

a second tape feed mechanism provided in an upstream side in the tape running path and feeds a following tape which is subsequently fed of the two carrier tapes one after another from the tape introducing port side toward the first tape feed mechanism;

wherein the second tape feed mechanism includes a sprocket which allows a plurality of feed pins provided on an outer peripheral surface of the sprocket to be fitted in feed holes of the carrier tape to feed the carrier tape in a state where the sprocket is engaged with the carrier tape by rotating the sprocket in a normal direction so as to feed the carrier tape, and a rotation detecting unit which detects a rotation of the sprocket; and a tape slipping-off deciding unit which decides that the following tape is slipped off from the second tape feed mechanism in accordance with a detection of a rotation of the sprocket in an opposite direction to the normal direction by the rotating detecting unit.

4. The component mounting apparatus according to claim 3, wherein the tape feeder further includes a tape slipping-off informing unit which informs the component mounting apparatus that the following tape is slipped off from the second tape feed mechanism.

5. A component feeding method for feeding a carrier tape in which components are accommodated on a pitch by pitch basis by a tape feeder to supply the components to a component suction position for a mounting head in a component mounting apparatus which picks up, holds and mounts the components on a board by the mounting head, the component feeding method comprising:

a first tape feed step for feeding, by a first tape feed mechanism, a preceding tape which is firstly fed of two carrier tapes introduced one after another on the pitch by pitch basis in a tape feeding to the component suction position;

a second tape feed step for feeding a following tape which is subsequently fed of the two carrier tapes one after another from a tape introducing port side toward the first tape feed mechanism, by a second tape feed mechanism, wherein the second tape feed mechanism includes a sprocket which allows a plurality of feed pins provided on an outer peripheral surface of the sprocket to be fitted in feed holes of the carrier tape to feed the carrier tape in a state where the sprocket is engaged with the carrier tape by rotating the sprocket in a normal direction so as to feed the carrier tape, and a rotation detecting unit which detects a rotation of the sprocket; and a tape slipping-off deciding step for deciding that the following tape is slipped off from the second tape feed mechanism in accordance with a detection of a rotation of the sprocket in an opposite direction to the normal direction by the rotating detecting unit.

6. The component feeding method according to claim 5, wherein it is decided that the following tape is slipped off from the second tape feed mechanism in accordance with a detection of a rotation in an opposite direction to a normal direction in the second tape feed step in the second tape feed mechanism.

7. The component feeding method according to claim 5, further comprising a tape slipping-off informing step for informing that the following tape is slipped off.

* * * * *